United States Patent
McDonald et al.

(10) Patent No.: US 8,183,937 B2
(45) Date of Patent: May 22, 2012

(54) INTEGRATED CIRCUIT FREQUENCY GENERATOR

(75) Inventors: John Othniel McDonald, Mountain House, CA (US); Crist Y. Lu, Fremont, CA (US); Ilbok Lee, Los Altos Hill, CA (US)

(73) Assignee: Silego Technology, Inc., Santa Clara, CA (US)

( * ) Notice: Subject to any disclaimer, the term of this patent is extended or adjusted under 35 U.S.C. 154(b) by 26 days.

(21) Appl. No.: 12/658,766

(22) Filed: Feb. 12, 2010

(65) Prior Publication Data

US 2010/0214029 A1 Aug. 26, 2010

Related U.S. Application Data

(60) Provisional application No. 61/207,647, filed on Feb. 13, 2009, provisional application No. 61/276,184, filed on Sep. 8, 2009.

(51) Int. Cl.
*H03L 7/00* (2006.01)

(52) U.S. Cl. ............... 331/18; 331/1 R; 331/34; 331/44; 455/574

(58) Field of Classification Search .................... 331/34, 331/1 R, 18, 44; 455/574
See application file for complete search history.

(56) References Cited

U.S. PATENT DOCUMENTS

| | | | |
|---|---|---|---|
| 5,933,058 A | 8/1999 | Pinto et al. | |
| 6,324,084 B1 | 11/2001 | Fujisawa | |
| 6,590,376 B1 | 7/2003 | Bammert et al. | |
| 7,764,128 B2 * | 7/2010 | Kuo | ................ 331/44 |
| 2004/0032357 A1 | 2/2004 | White | |
| 2008/0157884 A1 | 7/2008 | Lee | |

* cited by examiner

*Primary Examiner* — Arnold Kinkead
(74) *Attorney, Agent, or Firm* — Van Pelt, Yi & James LLP

(57) ABSTRACT

An integrated circuit frequency generator is disclosed. In some embodiments, the frequency generator comprises an electronic oscillator configured to generate an oscillator frequency and calibration circuitry configured to periodically calibrate the electronic oscillator with respect to a reference frequency source. When a primary power source is unavailable, an output frequency is generated from the oscillator frequency, and the reference frequency source is periodically pulse powered-on to calibrate the electronic oscillator.

64 Claims, 4 Drawing Sheets ved by a memory coupled to the processor. In this specification, these implementations, or any other form that the invention may take, may be referred to as techniques. In

INTEGRATED CIRCUIT FREQUENCY GENERATOR

CROSS REFERENCE TO OTHER APPLICATIONS

This application claims priority to U.S. Provisional Patent Application No. 61/207,647 entitled GENERATING MULTIPLE CLOCK FREQUENCIES USING A SINGLE CRYSTAL filed Feb. 13, 2009 which is incorporated herein by reference for all purposes and U.S. Provisional Patent Application No. 61/276,184 entitled FREQUENCY GENERATOR filed Sep. 8, 2009 which is incorporated herein by reference for all purposes.

BACKGROUND OF THE INVENTION

Quartz crystals are typically employed as reference frequency sources in electronic systems due to their outstanding performance characteristics. Most electronic systems include at least one high frequency (e.g., MHz) crystal. High frequency crystals provide excellent phase noise, stability, and aging characteristics but have the drawback of consuming more power than lower frequency crystals. Thus, a high frequency crystal may be employed in a system when power consumption is not constrained. However, when power conservation is critical, use of a high frequency crystal may be unacceptable. Consequently, most systems also include at least one low frequency (e.g., 32.768 kHz) crystal for low power consumption needs. The low frequency crystal compromises phase noise, some stability, and some aging characteristics in return for a substantially lower power consumption.

Existing electronic systems typically include a plurality of crystals from which to generate required system frequencies under various operating conditions. For example, a typical notebook computer may include as many as nine crystal frequency sources. Although the reference frequency generated by a single high frequency crystal can be used to generate any required system frequency, the high frequency crystal consumes too much power and thus cannot be employed when power consumption is critical. Although the reference frequency generated by a single low frequency crystal can be used to generate any required system frequency, the low frequency crystal introduces unacceptable phase noise, e.g., when coupled to a phase-locked loop, and thus in many cases cannot be employed to generate other required system frequencies. No viable techniques exist for eliminating the need for a plurality of crystal frequency sources in electronic systems.

BRIEF DESCRIPTION OF THE DRAWINGS

Various embodiments of the invention are disclosed in the following detailed description and the accompanying drawings.

DETAILED DESCRIPTION

Figure 1A:
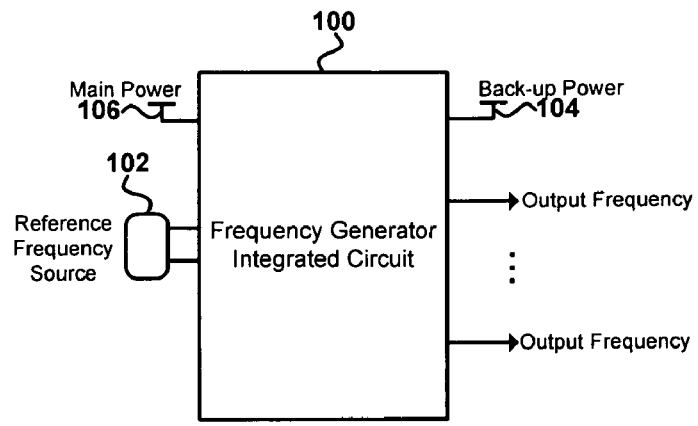
FIG. 1A illustrates a high level block diagram of an embodiment of a frequency generator integrated circuit.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

A micro-power integrated circuit frequency generator calibrated with a single high frequency quartz crystal is disclosed. The frequency generator described herein may be employed to generate multiple clock frequencies using semiconductor technology and one crystal rather than a plurality of crystals in systems that require a plurality of clock signals of various frequencies. Elimination of all but a single crystal frequency source in a system provides several benefits. For example, use of a single crystal with the disclosed integrated circuit frequency generator results in a lower cost in systems that would otherwise use a plurality of crystal frequency sources. Moreover, since lower frequency crystals are electro-mechanical devices that age and deteriorate over time, reducing the number of crystals in a system to just a single higher frequency crystal results in more robust aging characteristics and higher reliability due to fewer crystals. Furthermore, since crystals are relatively large devices, use of a single crystal with the disclosed integrated circuit frequency generator rather than a plurality of crystals results in less board space being consumed for clock frequency generation.

As further described herein, the frequency generator integrated circuit may be employed to generate low frequencies using a high frequency crystal source with high accuracy, over wide temperature ranges, and at very low power consumption. For example, a reference frequency generated by a high frequency crystal source in the MHz range may be employed by the frequency generator to generate a 32.768 kHz clock having an accuracy on the order of +/−20 parts per million of error and with a current consumption on the order of 1-10 μA depending on short term accuracy considerations. In existing systems, the 32.768 kHz frequency is typically generated using a dedicated 32.768 kHz crystal to maintain high accuracy and low power consumption. Generating the 32.768 kHz frequency with high accuracy and low power consumption is essential because this frequency is employed in real time clock (RTC) applications in most computer and consumer electronic products. Very low power consumption is essential because most systems that include RTC functions maintain timekeeping even when the systems are in a sleep state or powered off and thus need to maintain these functions under backup battery power. The frequency generator integrated circuit described herein eliminates the need for a separate 32.768 kHz crystal while still providing at least comparable and in most cases improved performance.

Figure 1B:
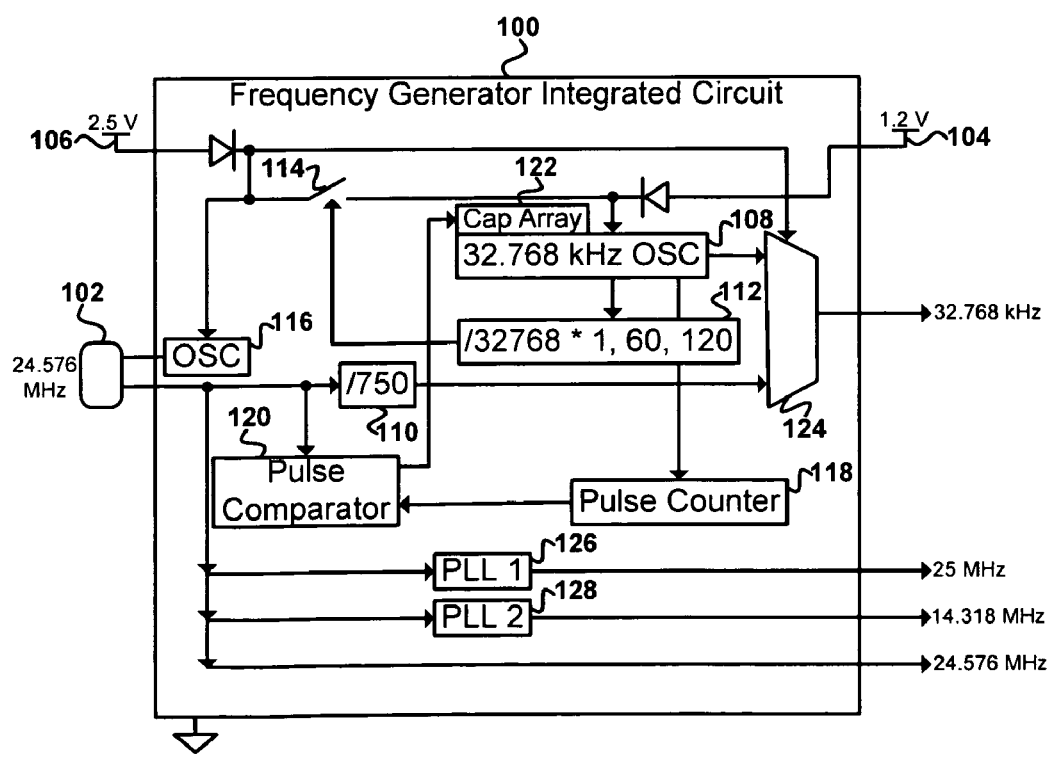
FIG. 1B illustrates a high level functional block diagram of the components comprising an embodiment of a frequency generator integrated circuit.

FIGS. 1A-1B illustrate high level functional block diagrams of embodiments of a frequency generator integrated circuit that generates one or more frequencies using a single reference frequency source. Although a 24.576 MHz crystal reference frequency source and a particular integrated circuit configuration to generate various frequencies including a 32.768 kHz frequency are described in some of the given examples, the disclosed techniques may be similarly employed with respect to any other appropriate reference frequency source and integrated circuit configuration to generate any one or more desired clock frequencies.

FIG. 1A illustrates a high level block diagram of an embodiment of a frequency generator integrated circuit. In the given example, frequency generator integrated circuit 100 employs reference frequency source 102 to generate one or more output clock frequencies. As depicted, all output frequencies are based on the reference frequency generated by reference frequency source 102. In different modes of operation, frequency generator 100 may be powered by different power sources. During a sleep and/or power-off mode, frequency generator 100 is powered by a backup power source such as a coin cell battery, which is indicated in the given figure by power source 104. During an active and/or power-on mode, frequency generator 100 is powered by a main power source such as a wall power unit or main battery, which is indicated in the given figure by power source 106.

FIG. 1B illustrates a high level functional block diagram of the components comprising an embodiment of frequency generator 100. In the given example, only the components and/or connections relevant to describing the functionality of frequency generator 100 are depicted. In various embodiments, frequency generator 100 may comprise any other and/or different components and/or configuration to provide the described functionality. Frequency generator 100 may operate in either power-off mode or power-on mode. In power-off mode, non-essential circuitry is powered off, and frequency generator 100 only generates the one or more frequencies needed by an associated system when powered-off, such as the 32.768 kHz RTC frequency, using back-up battery power. In power-on mode, frequency generator 100 generates various frequencies needed by an associated system when powered-on, e.g., various frequencies in the range of 32.768 kHz-25 MHz in the given example. As depicted, frequency generator 100 is powered by a 1.2 V back-up power source 104 in power-off mode and a 2.5 V main power source 106 in power-on mode. In FIG. 1B, the reference frequency source comprises a 24.576 MHz quartz crystal 102.

In power-off mode, the 32.768 kHz output frequency is generated using electronic oscillator 108. However, compared to a crystal frequency source, an electronic oscillator is relatively unstable, and its accuracy drifts over time. In order to ensure a 32.768 kHz output having at least a prescribed accuracy, crystal 102 is periodically pulse powered on so that oscillator 108 can be periodically calibrated using the highly accurate reference frequency output by crystal 102. Periodically powering crystal 102 to provide a highly accurate reference frequency via which oscillator 108 can be calibrated and powering off crystal 102 until the next calibration cycle while in power-off mode results in the 32.768 kHz output frequency being generated with very low power consumption and on average with a very high accuracy since oscillator 108 is calibrated to track the accuracy of crystal 102. In power-on mode, power conservation is not as critical, and crystal 102 is powered on so that various frequencies needed by the system can be generated using the highly accurate reference frequency output by crystal 102. As a result, rather than using relatively lower power but unstable oscillator 108 to generate the 32.768 kHz output frequency in power-on mode, frequency divider 110 is instead employed to divide the reference frequency output by crystal 102 to produce the 32.768 kHz output frequency. Thus, as described in further detail below, frequency generator 100 is configured to operate in three states—power-off free run mode, power-off frequency calibration mode, and power-on mode.

In power-off mode, frequency generator 100 is powered by back-up power source 104. Back-up power source 104 comprises a backup battery such as a coin cell battery. In this mode, the main power source of an associated system is off or unavailable, and power conservation is critical. Certain system functions, such as RTC functions, need to be operational even when the system is off; and the clock frequencies required for these functions, such as 32.768 kHz, need to be generated by frequency generator 100. Frequency generator 100 employs an electronic oscillator 108 to generate an output clock frequency in this mode. Oscillator 108 may comprise any appropriate electronic oscillator or equivalent electronic circuit. For example, oscillator 108 may comprise a ring oscillator, a DCO (digitally-controlled oscillator), a VCO (voltage-controlled oscillator), an LC VCO, etc. An oscillator having any desired configuration and characteristics may be selected based on the needs of the application. In most cases, a low power (e.g., in the μW range) oscillator is desirable since power conservation is critical in power-off mode. Frequency generator 100 of FIG. 1B includes a 32.768 kHz oscillator 108 to generate a 32.768 kHz output frequency. In other embodiments, an oscillator having a different frequency than a desired output frequency may be employed in combination with a frequency multiplier and/or frequency divider or other equivalent circuitry to generate a prescribed output frequency. For example, a 131.072 kHz oscillator and divide-by-four frequency divider may be employed to generate a 32.768 kHz output frequency. Since the size of an oscillator is somewhat inversely proportional to frequency, it may be desirable to use an oscillator having a higher frequency and a frequency divider to produce a desired output frequency to achieve a smaller board area. For any desired output frequency, an optimal frequency for the oscillator may be selected based on process geometry. In some embodiments, oscillator 108 is completely integrated into frequency generator integrated circuit 100. In other embodiments, oscillator 108 may not be completely integrated into frequency generator integrated circuit 100 and may include one or more external components such as resistors, capacitors, transistors, etc., that contribute to the function of the oscillator.

In power-off free run mode, only oscillator 108 and other essential circuitry are powered by back-up power source 104. A free running oscillator, however, is inherently a relatively unstable and inaccurate device, typically having an error on the order of +/−20000 ppm and higher. Various factors contribute to the frequency error. An oscillator is highly sensitive to thermal variations. For example, several hundred ppm of frequency error typically results for each degree Celsius change in temperature of an associated integrated circuit. Other factors that contribute to frequency error include process variations during manufacturing and mechanical stresses during the mounting of an associated integrated circuit to a printed circuit board. The large error of an untrimmed electronic oscillator cannot be tolerated by many system functions, including RTC functions. In order for oscillator 108 and an associated output frequency to have an acceptable level of accuracy (e.g., on the order of +/−20 ppm of error), dynamic calibration is periodically performed to trim oscillator 108.

Frequency generator 100 includes timer 112 which facilitates toggling between power-off free run and frequency calibration modes. In some embodiments, calibration timer 112 comprises a counter. In some such cases, timer 112 counts a prescribed number of pulses output by oscillator 108 between calibration cycles and may be programmed or configured for any desired calibration interval or period. More frequent calibration of oscillator 108 results in higher power consumption but greater short term accuracy of the output frequency associated with oscillator 108 while less frequent calibration of oscillator 108 results in lower power consumption but also lower short term accuracy of the output frequency associated with oscillator 108. However, despite the selected calibration interval, on average the output frequency associated with oscillator 108 has an accuracy that is comparable to that of a crystal since oscillator 108 is periodically calibrated using the relatively accurate (e.g., +/−20 ppm of error) reference frequency generated by crystal 102 as further described below. In the example of FIG. 1B, one of three calibration intervals may be selected for timer 112: every 32768*1 pulses or equivalently every second for a 32.768 kHz oscillator, every 32768*60 pulses or equivalently every minute for a 32.768 kHz oscillator, or every 32768*120 pulses or equivalently every two minutes for a 32.768 kHz oscillator. In other embodiments, timer 112 may be programmed or configured for any desired calibration interval. After a prescribed number of pulses or time period since the last calibration cycle, e.g., as determined by timer 112, frequency generator 100 switches from power-off free run mode to power-off frequency calibration mode while continuing to output the 32.768 kHz frequency generated by oscillator 108. In the given example, toggling from power-off free run mode to power-off frequency calibration mode is achieved by closing switch 114, which powers on crystal 102 and other calibration circuitry with back-up power source 104.

In power-off frequency calibration mode, crystal 102 is briefly turned on to calibrate oscillator 108. Closing switch 114 powers on oscillator 116, which drives crystal 102. Oscillator 116 may comprise any appropriate oscillator or other circuit that can be used as a driver for crystal 102. After sufficient time (e.g., ~0.5 ms) has lapsed for crystal 102 to settle to a steady state frequency after turn-on, the reference frequency generated by crystal 102 is used to calibrate oscillator 108. In the given example, counter 118 counts a prescribed number of pulses of oscillator 108 while pulse comparator logic 120 (which in some embodiments also includes a counter) counts the number of pulses output by crystal 102 during that period. For example, pulse comparator logic 120 may be configured to count the number of pulses of 24.576 MHz crystal 102 that transpire during the period of time counter 118 counts 264 pulses of 32.768 kHz oscillator 108, which is approximately equivalent to 8 ms. Ideally, there should exist a fixed ration of 750 24.576 MHz pulses for each 32.768 kHz pulse. Pulse comparator logic 120 is able to determine whether the current actual frequency of oscillator 108 is too high or too low based on the number of pulses of the 24.576 MHz crystal 102 counted during the period of time counter 118 counts 264 pulses of oscillator 108. Based on the determination, pulse comparator logic 120 appropriately trims oscillator 108 to correct the frequency error of oscillator 108. Any of a variety of trimming techniques known in the art may be employed to trim oscillator 108. In the given example, pulse comparator logic 120 adjusts a capacitor array 122 connected to oscillator 108 to correct the frequency error of oscillator 108. In this example, adding more capacitance to oscillator 108 decreases its frequency while removing capacitance from oscillator 108 increases its frequency. One or more further iterations of comparing the pulses of oscillator 108 with respect to the pulses of crystal 102 and adjusting capacitor array 122, as applicable, may be performed until oscillator 108 closely tracks the accuracy of crystal 102. Once the calibration process has completed, switch 114 is opened, which powers off crystal 102 as well as the other calibration circuitry and returns frequency generator 100 back to power-off free run mode, which is the lowest power consumption mode.

In the example described above, 264 pulses of oscillator 108 are counted by counter 118 and employed by pulse comparator logic 120 to determine the frequency error of oscillator 108. In other embodiments, any number of pulses of oscillator 108 may be used to determine the frequency error of the oscillator, and counter 118 and pulse comparator logic 120 may be accordingly configured. In some cases, the number of pulses of oscillator 108 used to make a frequency error determination may be based on a desired accuracy resolution. A better accuracy is achievable using more pulses; however, fewer pulses may be employed if compromising accuracy at least to a certain extent is tolerable. For example, a single pulse of oscillator 108 may be sufficient to calibrate it to approximately +/−1000 ppm of error. Comparing fewer pulses of oscillator 108 during each iteration of a calibration cycle results in less power consumption per iteration but at the expense of accuracy resolution. The accuracy resolution also depends on the number of iterations performed during each calibration cycle. In some embodiments, a prescribed number of iterations may be performed during each calibration cycle. Alternatively, in some embodiments, as many iterations needed to achieve a prescribed accuracy may be performed during each calibration cycle. Fewer iterations during a calibration cycle result in lower power consumption but at the expense of less accuracy.

As described, the accuracy of the output frequency associated with oscillator 108 and the power consumed to generate it during power-off mode depend on various parameters such as the type of oscillator 108, the number of pulses of oscillator 108 compared against the reference frequency generated by crystal 102 during an iteration of a calibration cycle, the number of iterations for adjusting the frequency of oscillator 108 per calibration cycle, the frequency of the calibration cycles, etc. Such parameters may be tunable and selected based on the needs of an associated system. A higher accuracy is achievable with longer and/or more frequent calibration cycles but at the expense of more power consumption. A lower power consumption is achievable with shorter and/or less frequent calibration cycles but at the expense of reduced accuracy. Regardless, frequency generator 100 may be employed to generate a clock frequency while in power-off mode having an accuracy comparable to that of a quartz crystal (e.g., +/−20 ppm of error) and with a very low power consumption (e.g., a few μW). As described with respect to the example of FIG. 1B, frequency generator 100 generates a very low power 32.768 kHz clock frequency having an accuracy comparable to that of the reference frequency generated by high frequency crystal 102. The power consumption of high frequency crystal 102 during power-off mode is drastically reduced by only intermittently or periodically turning it on rather than keeping it on continuously.

Although a particular technique and circuitry for calibrating oscillator 108 with respect to crystal 102 is depicted by and described with respect to FIG. 1B, in various embodiments, any other appropriate technique or circuitry may be employed. For example, in some embodiments, a frequency-locked loop (FLL) may be employed to calibrate oscillator 108. In some such cases, sigma-delta modulation may be employed with the FLL to control oscillator 108. For example, a sigma-delta modulator may be inserted between a conventional FLL control output and the oscillator that it controls. In some embodiments, the sigma-delta modulator creates frequent updates to the oscillator based on a slow-changing FLL output, thereby achieving suppression of quantization error without requiring a fast-updating FLL.

In power-on mode, frequency generator 100 is powered by main power source 106. In various embodiments, any appropriate switching technique to switch between power source 104 and power source 106 may be employed when switching between power-off and power-on modes. In some cases, a switching technique that is compatible with multiple power sources of possibly differing values or voltages is employed. In power-on mode, power conservation is not as critical. However, it is still important to generate accurate clock frequencies. In power-on mode, crystal 102 is turned-on so that the reference frequency generated by crystal 102 can be used to generate various clock frequencies needed by an associated system. In various embodiments, frequency multipliers, frequency dividers, frequency-locked loops, phase-locked loops, or any other appropriate circuitry may be employed in power-on mode to generate various clock frequencies using the reference frequency of crystal 102. In some embodiments, frequency generator 100 employs fractional-n dividers or synthesizers, e.g., because simple metal or non-volatile memory programming can be employed with such devices to achieve a proper divide ratio for any reference frequency to generate a desired output frequency.

In FIG. 1B, the 24.576 MHz reference frequency generated by crystal 102 is divided by 750 by frequency divider 110 to generate the 32.768 kHz output frequency in power-on mode. Low power electronic oscillators such as oscillator 108 are extremely sensitive to thermal variations and tend to drift and perform poorly in an environment in which temperature gradients occur. Consequently, oscillator 108 may not be employed to generate the 32.768 kHz output frequency in power-on mode in some embodiments due to the thermal variations arising from the activity of various other devices on an associated die and/or circuit in power-on mode. However, in some embodiments, oscillator 108 may be employed to generate the 32.768 kHz output frequency in power-on mode if the calibration rate is increased to account for the additional thermal related error. Because power conservation is not as critical in power-on mode, the 32.768 kHz output frequency may be generated directly by dividing the 24.576 MHz frequency produced by crystal 102 or the calibration rate may be increased. In the example of FIG. 1B, the output of multiplexor 124 switches from the output of oscillator 108 in power-off mode to the output of frequency divider 110 in power-on mode. Any appropriate phase alignment techniques known in the art may be employed to ensure a seamless 32.768 kHz output when switching sources of the output frequency.

In some embodiments, frequency generator 100 may be configured to generate a single output frequency (e.g., 32.768 kHz) in all operational modes. In the embodiment of FIG. 1B, frequency generator 100 is also configured to output 25 MHz, 14.318 MHz, and 24.576 MHz clock frequencies in power-on mode. As depicted, phase-locked loops 126 and 128 are employed in power-on mode to generate output frequencies of 25 MHz and 14.318 MHz, respectively, from the 24.576 MHz reference frequency of crystal 102. In the given example, frequency generator 100 integrates phase-locked loops 126 and 128. In other embodiments, such circuitry may not be integrated in frequency generator 100 and may instead comprise external components. In various embodiments, frequency generator 100 may be implemented differently than the example provided in FIG. 1B and may be configured to generate or output any number of copies of any one or more frequencies.

As described, the thermal induced frequency error of electronic oscillator 108 due to power-on temperature gradients is circumvented by switching from oscillator 108 to simply dividing the reference frequency of crystal 102 by divider 110 during power-on mode to produce the 32.768 kHz output frequency. Temperature gradients also occur when switching from power-on mode to power-off mode. A sudden cooling across an associated die and/or circuit when entering power-off mode introduces a transient error in oscillator 108 at least until a steady state power-off temperature is reached. Such errors may accumulate into a systematic offset or bias over time, especially if an associated system is frequently powered on and off. In various embodiments, the bias may be corrected or compensated using any appropriate techniques. In some cases, for instance, the bias is at least in part removed or averaged out by calibrating the oscillator very frequently at least for a short period of time after entering power-off mode as the associated system cools down. For example, oscillator 108 may be calibrated every 1/10 or 1/15 of a second for the first few minutes in power-off mode. In some cases, even though the output of oscillator 108 is not employed in power-on mode, the frequency error of the oscillator resulting from the temperature surge at turn-on is measured and stored and later subtracted at power-off to compensate for cool down.

FIG. 1B illustrates one embodiment of the manner in which a frequency generator integrated circuit may at least in part be implemented. In other embodiments, frequency generator 100 may be implemented and/or configured in any manner such that it provides the basic functionality of using a single high accuracy reference frequency source to generate any output clock frequency having a comparable accuracy as the reference frequency source and at a very low power consumption at least in power-off mode.

Figure 2:
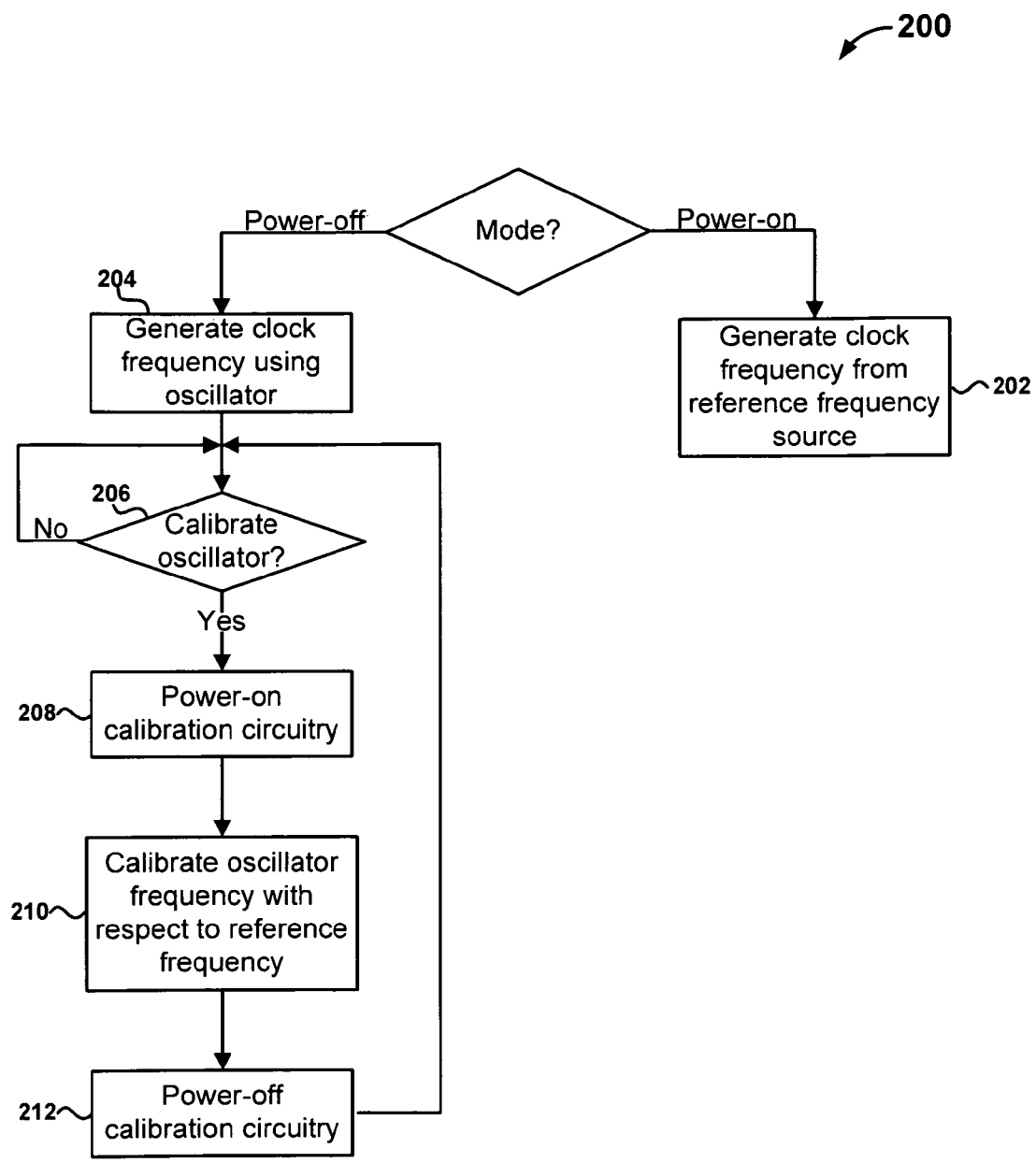
FIG. 2 illustrates an embodiment of a process for generating a clock frequency.

FIG. 2 illustrates an embodiment of a process for generating a clock frequency having high accuracy and very low power consumption in power-off mode using a single reference frequency source. In some embodiments, process 200 is employed by frequency generator 100 of FIGS. 1A-1B. In some embodiments, process 200 is employed to generate the 32.768 kHz clock frequency in various operational modes. If in process 200 it is determined that the mode is power-on mode, the clock frequency is generated from the reference frequency source at 202. In some cases, for example, the reference frequency is divided using a frequency divider to generate the clock frequency. If in process 200 it is determined that the mode is power-off mode, the clock frequency is generated using a low power electronic oscillator at 204. At 206, it is determined whether to calibrate the oscillator. Since the oscillator is relatively unstable, it periodically needs to be trimmed so that the clock frequency generated using the oscillator has at least a prescribed accuracy. If it is determined at 206 to calibrate the oscillator, calibration circuitry (including the reference frequency source) is powered-on at 208. In some embodiments, 208 includes waiting for the reference frequency source to settle after turn-on. At 210, the oscillator frequency is calibrated with respect to the reference frequency. For example, 210 includes trimming the oscillator so that its accuracy closely tracks the accuracy of the reference frequency source. Once calibration of the oscillator is complete at 210, the calibration circuitry (including the reference frequency source) is powered off at 212 until the next calibration cycle, and process 200 continues at 206. In power-off mode, the clock frequency is generated using the low power electronic oscillator both during and between calibration cycles.

Figure 3:
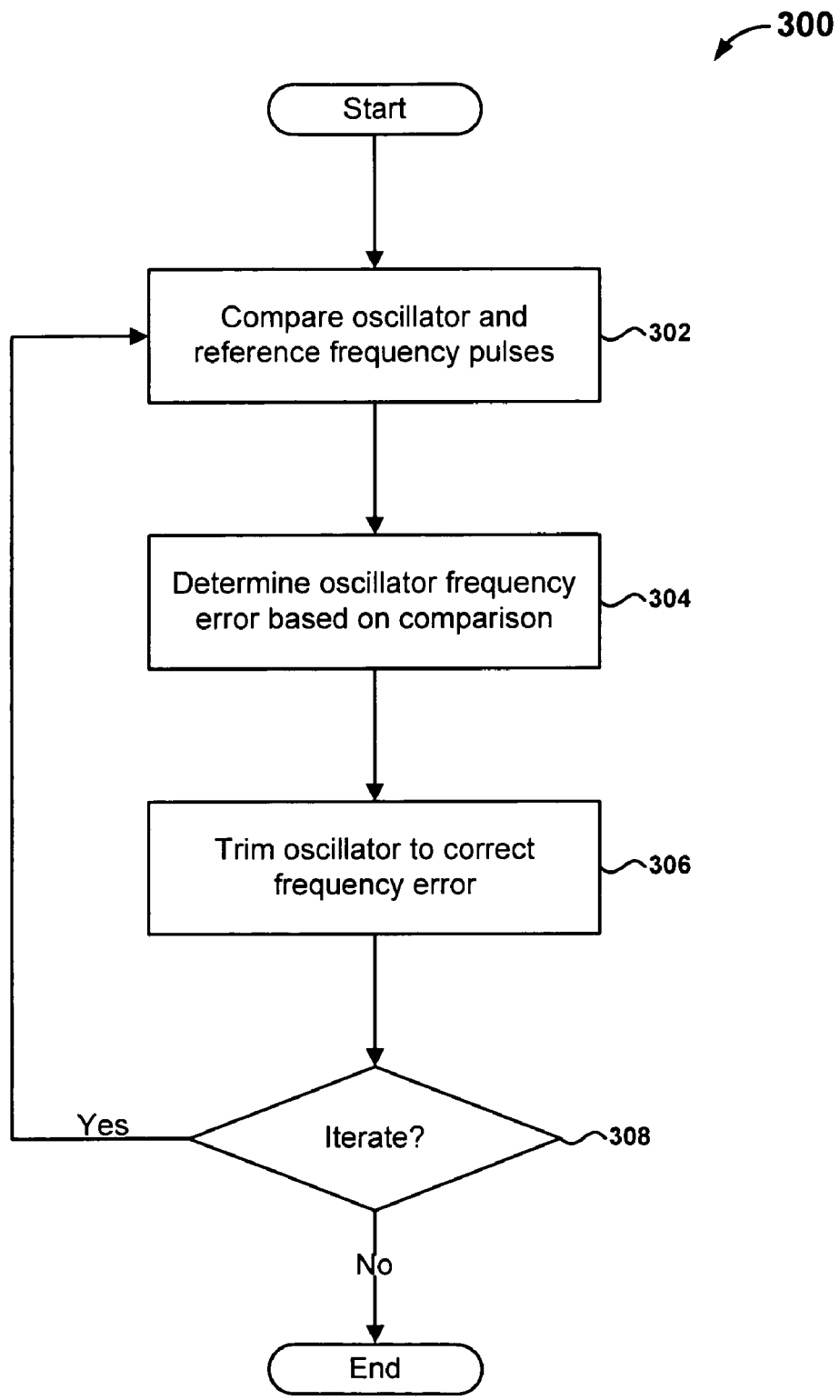
FIG. 3 illustrates an embodiment of a process for calibrating an oscillator.

FIG. 3 illustrates an embodiment of a process for calibrating an oscillator during power-off mode. In some embodiments, process 300 is employed at 210 of process 200. Process 300 starts at 302 at which the oscillator and reference frequency pulses are compared. In some cases, for example, the number of reference frequency pulses for a prescribed number of oscillator pulses are counted and compared to the number of reference frequency pulses that should occur for the prescribed number of oscillator pulses for an ideal oscillator frequency. At 304, the oscillator frequency error, if any, is determined based on the comparison of 302. In some cases, for example, 304 includes determining whether the actual oscillator frequency is higher or lower than the ideal oscillator frequency. At 306, the oscillator is trimmed, if applicable, to at least in part correct the frequency error determined at 304. At 308, it is determined whether to perform another iteration of process 300. In some embodiments, a prescribed number of iterations of process 300 are performed during a calibration cycle. In some embodiments, as many iterations needed to achieve a prescribed accuracy are performed during a calibration cycle. If it is determined at 308 to perform another iteration, process 300 continues at 302. If it is determined at 308 that the calibration cycle is complete, process 300 ends.

In various embodiments, a crystal having any frequency may be employed as the reference frequency source for frequency generator 100. For example, in some embodiments, crystal 102 comprises a 14.318 MHz crystal; and in such cases, frequency divider 110 may, for instance, comprise a fractional-n divider that divides by 437 for 131 pulses and divides by 736 for 6 pulses to yield a 32.768 kHz output frequency. In some embodiments, pulse comparator logic 120 includes logic to add or subtract a (digital) offset to compensate for difficult to achieve ratios between the reference frequency and an oscillator frequency, e.g., when comparing pulses of the oscillator and reference frequency during calibration.

In various embodiments, crystal 102 may have any type of cut, such as AT, BT, CT, SC, etc. Different performance characteristics are associated with different cuts. For example, the orientation of a cut influences parameters such as frequency stability, thermal characteristics, aging characteristics, etc. The SC cut, for instance, has excellent aging properties and almost no frequency versus temperature error at higher temperatures. It may be advantageous to select the cut of the crystal based at least in part on the intended application since the performance characteristics associated with the crystal are also exhibited by any frequencies generated using the crystal frequency. Instead of a quartz crystal, any other high accuracy frequency source may be employed in various embodiments such as a pulse powered AlN, MEMs, tuned LC, or other resonator technology used for frequency generation in electronic circuits.

In various embodiments, frequency generator 100 may be configured to generate or output one or more frequencies of one or more values in various operational modes. Generation of a 32.768 kHz output frequency in power-off mode is described with respect to some of the examples provided herein because this frequency is typically used for RTC functions and chip beaconing during sleep wake-up. In other embodiments, frequency generator 100 may be configured and may include appropriate circuitry to generate any one or more output frequencies during power-off mode in addition to and/or instead of 32.768 kHz. In some cases, frequency generator 100 may include a plurality of electronic oscillators and associated calibration circuitry to generate a plurality of output, frequencies using oscillators during power-off mode. Likewise, frequency generator 100 may be configured and may include appropriate circuitry to generate any one or more output frequencies during power-on mode. In some cases, for example, frequency generator 100 may include integrated phase-locked loops or other equivalent circuitry to generate one or more 96 MHz DOT clocks, 48 MHz USB clocks, high frequency (e.g., 125 MHz-2 GHz) clocks, etc.

A system may comprise various time-related elements (e.g., delays, oscillators, power-on resets, sleep timers, etc.) and/or frequency-related elements (e.g., auto-zero circuits, charge pumps, analog-to-digital converters, counters, etc.). In some embodiments, the outputs of frequency generator 100 are branched out to one or more components in a system that require an accurate time and/or frequency base. In some embodiments, a single clock output of frequency generator 100 may be employed to drive a plurality of clock inputs. In some cases, using frequency generator 100 for all or at least a portion of the timing and/or frequency requirements of an associated system eliminates or at least reduces error and mitigates the effects of process, temperature, and voltage variations from the system. In various embodiments, frequency generator 100 may be configured to generate or output any combination, any number of copies, any multiple of, and/or any integer or fractional divide of one or more frequencies. For example, in some cases, frequency generator 100 may be configured to generate or output multiple copies of the same low frequency (e.g., 32.768 kHz).

An error or systematic offset may be introduced into an output frequency of frequency generator 100 due to various sources. In various embodiments, an error introduced into an output frequency of frequency generator 100 may be corrected or tuned at any stage and in any appropriate manner. Different errors may be introduced in different modes of operation (e.g., power-off and power-on) and in some embodiments may be independently tuned. In some cases, an error may be introduced if synchronous noise is present at the calibration frequency in power-off mode. In some cases, such an error may at least in part be corrected and/or averaged out by dithering the calibration frequency. For instance, calibration of an oscillator every 2.5 s can be dithered such that on average the oscillator is calibrated every 2.5 s but actual calibration periods comprise values around 2.5 s, such as 2.4-2.6 s, so that, for example, a noise harmonic that also has a frequency of every 2.5 s does not create an error offset. In some cases, reference frequency source 102 may introduce an error, which if uncorrected, propagates to any output frequency generated based on the reference frequency. In various embodiments, an error introduced by a reference frequency source such as crystal 102 may be tuned in any appropriate manner. In some embodiments, an error introduced by reference frequency source 102 is externally tuned, e.g., using a resistor or capacitor, by strapping pins or bond wires to the reference frequency source, etc. In some embodiments, an error introduced by reference frequency source 102 is internally tuned by frequency generator 100, e.g., with an integrated resistor, capacitor, transistor, etc., that is connected to reference frequency source 102 via a serial or parallel communications bus. In some embodiments, short-term jitter on the reference clock is at least in part removed by combining a prescribed number of consecutive clock pulses or cycles into a single pulse to reduce or average out jitter and reconstructing the reference clock using such combined pulses. In some cases, an error may be introduced due to EMI (electromagnetic interference) between the output frequency or frequencies of frequency generator 100 and reference frequency source 102, especially if the reference frequency source is on the same die and/or in the same package. In some embodiments, frequency generator 100 integrates any appropriate spread spectrum circuitry to reduce EMI (electromagnetic interference).

In some cases, pulse powering reference frequency source 102 creates a current spike that introduces an IR drop in an associated bond wire during calibration. The voltage drop across the bond wire is present during calibration mode but disappears in free run mode when the reference frequency source is powered off. As a result, the voltage drop across the bond wire occurring during calibration manifests as a constant frequency error in the calibrated oscillator. Any appropriate technique to tune or correct for this error may be employed in various embodiments. In some cases, for example, the value of such a voltage offset is determined using the following process. Reference frequency source 102 is first powered-on at X current, and the frequency error in oscillator 108 at X current is measured and stored. Next, the current driving reference frequency source 102 is changed to X+Y, and the frequency error in oscillator 108 at X+Y current is measured and stored. Finally, the current driving reference frequency source 102 is changed to Y current. The total current related offset error at Y current is the difference between the oscillator frequency errors measured at X current and X+Y current, i.e., errorX-errorX+Y, and is compensated by subtracting this value from the oscillator.

Figure 4:
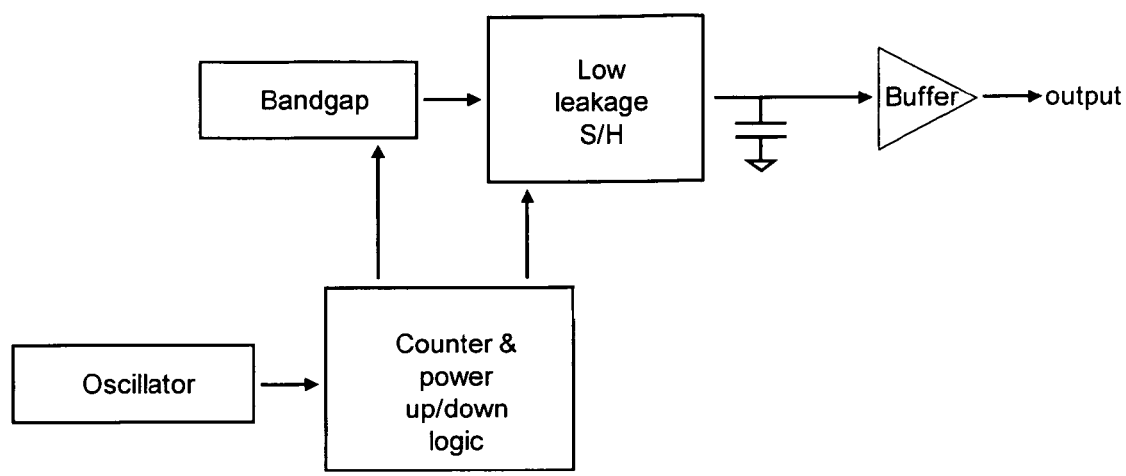
FIG. 4 illustrates an embodiment of regulator circuitry.

Alternately enabling and disabling (i.e., pulse powering) a circuit can reduce the power consumption of the circuit on average, provided that the circuit is not needed some of the time. This condition is usually not true for a regulator circuit that provides a regulated power supply to other circuits. Regulator accuracy is difficult to achieve when power consumption needs to be very low, e.g., less than 1 µA or 100 nA. In some embodiments, an alternately enabled and disabled (i.e., pulse powered) bandgap regulator with a low power sample-and-hold circuit may be employed to achieve both accurately regulated, continuously-available supply voltage and very low power consumption at the same time. A block diagram of an embodiment of the circuitry is provided in FIG. 4. In this example, total power consumption is on the order of 100 nA.

In various embodiments, higher levels of integration are achievable by integrating frequency generator integrated circuit 100 with any other analog and/or digital circuitry. Integrating additional circuitry with frequency generator 100 is often very cost effective, e.g., since higher integration reduces overhead associated with handling, packaging, and testing costs. In some embodiments, frequency generator 100 provides a core around which all or at least some of a system's timing and clock generation, distribution, and/or utilization can be included. In some embodiments, frequency generator 100 includes one or more integrated phase-locked loops to generate various output frequencies, e.g., as described above with respect to the example of FIG. 1B. In some embodiments, real time clock/calendar circuitry is integrated into frequency generator 100.

In some embodiments, backup power source 104 comprises a power-off or sleep mode battery such as an RTC or CMOS battery. Such backup batteries are typically coin cell batteries of the CR, BR, or ML re-chargeable type and are employed to power only critical circuit elements that are never turned off, such as RTC circuitry. The CR and BR coin cell batteries are not rechargeable. However, the ML coin cell battery is re-chargeable and finding widespread and growing use within the electronic industry. From a system design perspective, the CR and BR batteries may offer, for example, 10 years of battery life for a given RTC circuit before needing replacement. The replacement issue necessitates CR and BR batteries to be placed in a small battery holder that allows easy replacement. A smaller ML battery may be selected for the same application that gives only one year of battery life per charge. If the associated electronic product has a main battery installed or is plugged into a wall socket at least once per year to allow the ML battery to be re-charged, there is no need to replace the battery for the lifetime of the product. Thus, with the ML battery, a system designer can elect a smaller form factor and the elimination of a battery holder but with the added penalty of a charger circuit and the user limitation of periodically providing a charging power source.

An ML coin cell battery charger in its most basic form may quite simply be implemented. In some embodiments, the charger may comprise a simple diode and current limiting resistor attached to a constant voltage. For example, if a 3.3 V power rail is available, a Schottky diode may be placed in series with a 1000Ω resistor and connected directly to the +node of the ML battery. In such cases, if the ML battery falls below full charge (e.g., ~3 V), a small trickle charge (e.g., ~100-250 µA) flows into the battery to re-charge it. If 3.3 V is not available, the charger may be slightly more complex. For example, if a 5 V power rail is available, there exists many ways to ensure that the battery is not over-voltaged or over-charged. For example, a simple transistor and resistors may be used to both current limit and shut-off charging when the voltage approaches the maximum limit of the ML battery. Various techniques to ensure that the ML battery is not over-voltaged or over-charged may include or make use of one or more of the following functions or circuit elements: DC/DC converters; charge pumps; voltage dividers; LDO (low-drop-out) regulators; voltage regulators; circuits comprising operational amplifiers or voltage or current references; etc.

In some embodiments, backup battery management and/or charger circuitry (e.g., for managing and/or charging backup battery 104) is integrated into frequency generator integrated circuit 100. The charger circuitry may be appropriately configured for and/or employed with respect to any type of for re-chargeable backup battery, such as ML coin cell batteries, Lithium-ion batteries, etc. In many systems, a 32.768 kHz frequency generator, real time clock logic, sleep timers, etc., are powered from the same backup battery during power-off mode, and their circuitry is often directly tied to each other and in close proximity on a printed circuit board. Thus, integrating such circuitry in frequency generator 100 is in many cases advantageous, e.g., for component reduction, simplifying designer work by offering a pre-packaged and tested solution, reducing PCB (printed circuit board) area, etc.

In some embodiments, an external or integrated capacitor is employed with respect to frequency generator 100 for facilitating quick turn-on of reference frequency source 102. As described, reference frequency source 102 is periodically powered on in power-off mode to calibrate oscillator 108 of frequency generator 100. Fast turn-on of a high frequency crystal in many cases requires a large current over a short time period. For example, a current on the order of 1-10 mA may be needed for quick turn-on of a MHz crystal. However, a backup battery such as power source 104 may not be able to deliver such levels of current due to its internal resistance and UL (Underwriters Lab) current-limiting series resistor requirements. Such additional resistors may cause the voltage applied to the crystal to drop significantly, potentially affecting start-up performance. In some embodiments, a smoother start-up of reference frequency source 102 is achieved through use of a high value capacitor that is able to provide the necessary current during the time the reference frequency source is ramping up and active. During the time the reference frequency source is off, the capacitor is slowly re-charged by the backup battery within its rated specification for continuous and pulse output current. In some embodiments, the value of the storing capacitor may be reduced by pumping a high voltage onto it. In some cases, for example, the value of the capacitor may be halved for every doubling of the applied voltage.

In some embodiments, a non-volatile memory is used in conjunction with frequency generator 100. For example, the non-volatile memory may be employed to trim for a particular frequency, better frequency error versus environmental effects performance, and other clocking characteristics such as output buffer strength, calibration rate, synchronous or asynchronous calibration, etc. In various architectures, the non-volatile memory may be integrated on the same die as frequency generator 100, may be on a different die but part of the same package as frequency generator 100, may be a part of an external package, may be connected to another processor or SOC elsewhere in an associated system, etc. In various embodiments, the non-volatile memory may be used with respect to frequency generator 100 for input frequency selection; output frequency selection; frequency trimming the input frequency; frequency trimming the output frequency; frequency trimming the silicon oscillator; frequency trimming for offset, aging, temperature, power supply voltage, integrated circuit stress, or any other electrical or mechanical phenomena that may impact an output frequency; etc. In various embodiments, the non-volatile memory may be a floating gate type of re-programmable memory (e.g., flash, E2PROM, EPROM, etc.), one-time programmable memory, a SONOS type memory, fuse, anti-fuse, bonding wires, IC metal mask, FIB, pseudo non-volatile memory (volatile memory with battery back-up), etc. In some embodiments, the non-volatile memory is not physically located on the integrated circuit of frequency generator 100 but loaded and/ or adjusted from an external source. In some cases, for example, the non-volatile memory is located next to a processor, FPGA, or controller used to manipulate frequency generator 100.

In some embodiments, frequency generator 100 is packaged using WL-CSP or other chip scale packaging. In some embodiments, frequency generator 100 is combined with reference frequency source 102 into a single package. In some cases, for example, frequency generator 100 is placed inside a quartz crystal package. A smaller PCB footprint is achievable by placing the frequency generator die inside the quartz crystal package. In various embodiments, the crystal package may be of any size and/or type including metal, ceramic, glass fritz, etc.

In various embodiments, frequency generator 100 may be used for any appropriate application such as analog and digital watches and clocks; computers; portable media players; cameras; cell phones; media and/or storage applications; notebook computers; netbooks; consumer, industrial, medical, automotive, communications, and/or military applications; or any other application in which the benefits of less aging, less cost, smaller size, less frequency error over environmental conditions, etc., are valued. For example, traditionally a 32.768 kHz crystal has been used for RTC circuitry in such applications. However, compared to a 32.768 kHz crystal, a 32.768 kHz frequency generated by frequency generator 100 exhibits better performance in many respects. Consider, for example, a comparison of a 32.768 kHz tuning fork crystal and a 32.768 kHz frequency generated by frequency generator 100 using an AT cut crystal source 102. The 32.768 kHz frequency generated by frequency generator 100 exhibits similar performance characteristics as the AT cut crystal source. An AT cut crystal exhibits greater temperature stability than a 32.768 kHz tuning fork crystal. A 32.768 kHz tuning fork crystal is generally optimized for operation at 25° C.+/−5° C. and forms a parabolic frequency curve around this turnover temperature; however, an AT cut crystal has a flatter frequency curve from −40° C. to +85° C. Thus, any watch or other electronic device that includes an AT cut crystal based frequency generator 100 will have improved performance in very hot and very cold environments without any additional trimming or other integrated circuit design techniques. High performance operation in extreme environments is a key feature for many devices, including watches. Moreover, a small AT cut crystal has a higher shock and vibration resistance compared to a 32.768 kHz tuning fork crystal. Thus, an AT cut crystal based frequency generator 100 conveys higher immunity to shock and vibration without any additional material or mechanical design techniques. Furthermore, a small AT cut crystal ages at a slower rate than a tuning fork crystal. Thus, an AT cut crystal based frequency generator 100 conveys better aging performance.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;
   wherein the output frequency comprises a low frequency and wherein the reference frequency comprises a high frequency.

2. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;

wherein the output frequency comprises a real time clock frequency and wherein the reference frequency comprises a megahertz frequency.

3. A frequency generator integrated circuit for generating an output frequency, comprising:
- an electronic oscillator configured to generate an oscillator frequency; and
- calibration circuitry configured to periodically calibrate the electronic oscillator with respect to a reference frequency source;
- wherein when a primary power source is unavailable, the output frequency is generated from the oscillator frequency and the reference frequency source is periodically pulse powered-on to calibrate the electronic oscillator;
- wherein the reference frequency source comprises a quartz crystal.

4. A frequency generator integrated circuit for generating an output frequency, comprising:
- an electronic oscillator configured to generate an oscillator frequency; and
- calibration circuitry configured to periodically calibrate the electronic oscillator with respect to a reference frequency source;
- wherein when a primary power source is unavailable, the output frequency is generated from the oscillator frequency and the reference frequency source is periodically pulse powered-on to calibrate the electronic oscillator;
- wherein the output frequency is one of a plurality of output frequencies generated by the frequency generator integrated circuit.

5. The frequency generator integrated circuit of claim 4, wherein each of the plurality of output frequencies is based on or generated from the reference frequency source.

6. A frequency generator integrated circuit for generating an output frequency, comprising:
- an electronic oscillator configured to generate an oscillator frequency; and
- calibration circuitry configured to periodically calibrate the electronic oscillator with respect to a reference frequency source;
- wherein when a primary power source is unavailable, the output frequency is generated from the oscillator frequency and the reference frequency source is periodically pulse powered-on to calibrate the electronic oscillator;
- wherein the electronic oscillator is calibrated at a low duty cycle to conserve power.

7. A frequency generator integrated circuit for generating an output frequency, comprising:
- an electronic oscillator configured to generate an oscillator frequency; and
- calibration circuitry configured to periodically calibrate the electronic oscillator with respect to a reference frequency source;
- wherein when a primary power source is unavailable, the output frequency is generated from the oscillator frequency and the reference frequency source is periodically pulse powered-on to calibrate the electronic oscillator;
- wherein the output frequency is generated at very low power consumption when the primary power source is unavailable.

8. A frequency generator integrated circuit for generating an output frequency, comprising:
- an electronic oscillator configured to generate an oscillator frequency; and
- calibration circuitry configured to periodically calibrate the electronic oscillator with respect to a reference frequency source;
- wherein when a primary power source is unavailable, the output frequency is generated from the oscillator frequency and the reference frequency source is periodically pulse powered-on to calibrate the electronic oscillator;
- wherein an accuracy of the output frequency is comparable to an accuracy of the reference frequency.

9. A frequency generator integrated circuit for generating an output frequency, comprising:
- an electronic oscillator configured to generate an oscillator frequency; and
- calibration circuitry configured to periodically calibrate the electronic oscillator with respect to a reference frequency source;
- wherein when a primary power source is unavailable, the output frequency is generated from the oscillator frequency and the reference frequency source is periodically pulse powered-on to calibrate the electronic oscillator;
- wherein the calibration circuitry comprises one or more counters.

10. A frequency generator integrated circuit for generating an output frequency, comprising:
- an electronic oscillator configured to generate an oscillator frequency; and
- calibration circuitry configured to periodically calibrate the electronic oscillator with respect to a reference frequency source;
- wherein when a primary power source is unavailable, the output frequency is generated from the oscillator frequency and the reference frequency source is periodically pulse powered-on to calibrate the electronic oscillator;
- wherein the calibration circuitry comprises a frequency-locked loop.

11. The frequency generator integrated circuit of claim 10, wherein the calibration circuitry comprises a sigma-delta modulator.

12. A frequency generator integrated circuit for generating an output frequency, comprising:
- an electronic oscillator configured to generate an oscillator frequency; and
- calibration circuitry configured to periodically calibrate the electronic oscillator with respect to a reference frequency source;
- wherein when a primary power source is unavailable, the output frequency is generated from the oscillator frequency and the reference frequency source is periodically pulse powered-on to calibrate the electronic oscillator;
- wherein the calibration circuitry comprises circuitry to trim the electronic oscillator.

13. A frequency generator integrated circuit for generating an output frequency, comprising:
- an electronic oscillator configured to generate an oscillator frequency; and
- calibration circuitry configured to periodically calibrate the electronic oscillator with respect to a reference frequency source;
- wherein when a primary power source is unavailable, the output frequency is generated from the oscillator frequency and the reference frequency source is periodically pulse powered-on to calibrate the electronic oscillator;

wherein the calibration circuitry comprises circuitry for compensating an error.

14. A frequency generator integrated circuit for generating an output frequency, comprising:
   an electronic oscillator configured to generate an oscillator frequency;
   calibration circuitry configured to periodically calibrate the electronic oscillator with respect to a reference frequency source; and
   further comprising spread spectrum circuitry to reduce electromagnetic interference;
   wherein when a primary power source is unavailable, the output frequency is generated from the oscillator frequency and the reference frequency source is periodically pulse powered-on to calibrate the electronic oscillator.

15. A frequency generator integrated circuit for generating an output frequency, comprising:
   an electronic oscillator configured to generate an oscillator frequency;
   calibration circuitry configured to periodically calibrate the electronic oscillator with respect to a reference frequency source; and
   further comprising circuitry for reducing jitter in the reference frequency;
   wherein when a primary power source is unavailable, the output frequency is generated from the oscillator frequency and the reference frequency source is periodically pulse powered-on to calibrate the electronic oscillator.

16. A frequency generator integrated circuit for generating an output frequency, comprising:
   an electronic oscillator configured to generate an oscillator frequency;
   calibration circuitry configured to periodically calibrate the electronic oscillator with respect to a reference frequency source; and
   further comprising circuitry for enabling and disabling the calibration circuitry;
   wherein when a primary power source is unavailable, the output frequency is generated from the oscillator frequency and the reference frequency source is periodically pulse powered-on to calibrate the electronic oscillator.

17. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;
   wherein a calibration frequency for calibrating the electronic oscillator is dithered.

18. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;
   wherein the primary power source comprises a wall power unit or main battery.

19. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;
   wherein when the primary power source is unavailable, essential circuitry is powered using a secondary power source.

20. The frequency generator integrated circuit of claim 19, wherein the secondary power source comprises a back-up battery.

21. A frequency generator integrated circuit for generating an output frequency, comprising:
   an electronic oscillator configured to generate an oscillator frequency;
   calibration circuitry configured to periodically calibrate the electronic oscillator with respect to a reference frequency source; and
   regulator circuitry comprising an alternately enabled and disabled bandgap regulator and a low power sample-and-hold circuit;
   wherein when a primary power source is unavailable, the output frequency is generated from the oscillator frequency and the reference frequency source is periodically pulse powered-on to calibrate the electronic oscillator.

22. A frequency generator integrated circuit for generating an output frequency, comprising:
   an electronic oscillator configured to generate an oscillator frequency;
   calibration circuitry configured to periodically calibrate the electronic oscillator with respect to a reference frequency source; and
   circuitry for switching between power supplies having different, non-zero values;
   wherein when a primary power source is unavailable, the output frequency is generated from the oscillator frequency and the reference frequency source is periodically pulse powered-on to calibrate the electronic oscillator.

23. A frequency generator integrated circuit for generating an output frequency, comprising:
   an electronic oscillator configured to generate an oscillator frequency;
   calibration circuitry configured to periodically calibrate the electronic oscillator with respect to a reference frequency source; and
   a frequency divider for generating the output frequency from the reference frequency when a primary power source is available;

wherein when the primary power source is unavailable, the output frequency is generated from the oscillator frequency and the reference frequency source is periodically pulse powered-on to calibrate the electronic oscillator.

24. A frequency generator integrated circuit for generating an output frequency, comprising:
   an electronic oscillator configured to generate an oscillator frequency;
   calibration circuitry configured to periodically calibrate the electronic oscillator with respect to a reference frequency source; and
   one or more integrated phase-locked loops to generate one or more output frequencies including the output frequency from the reference frequency when a primary power source is available;
   wherein when the primary power source is unavailable, the output frequency is generated from the oscillator frequency and the reference frequency source is periodically pulse powered-on to calibrate the electronic oscillator.

25. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;
   wherein the electronic oscillator includes one or more external components that are not integrated into the frequency generator integrated circuit.

26. A frequency generator integrated circuit for generating an output frequency, comprising:
   an electronic oscillator configured to generate an oscillator frequency;
   calibration circuitry configured to periodically calibrate the electronic oscillator with respect to a reference frequency source; and
   integrated battery charger circuitry;
   wherein when a primary power source is unavailable, the output frequency is generated from the oscillator frequency and the reference frequency source is periodically pulse powered-on to calibrate the electronic oscillator.

27. A frequency generator integrated circuit for generating an output frequency, comprising:
   an electronic oscillator configured to generate an oscillator frequency;
   calibration circuitry configured to periodically calibrate the electronic oscillator with respect to a reference frequency source; and
   integrated non-volatile memory;
   wherein when a primary power source is unavailable, the output frequency is generated from the oscillator frequency and the reference frequency source is periodically pulse powered-on to calibrate the electronic oscillator.

28. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;
   wherein the frequency generator integrated circuit is included in a watch or clock.

29. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;
   wherein the frequency generator integrated circuit is included in a device that includes real time clock circuitry.

30. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;
   wherein the output frequency drives a plurality of clock inputs in an associated system.

31. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;
   wherein the frequency generator integrated circuit is packaged with the reference frequency source in a single package.

32. A frequency generator integrated circuit for generating an output frequency, comprising:
   an electronic oscillator configured to generate an oscillator frequency; and
   calibration circuitry configured to periodically calibrate the electronic oscillator with respect to a reference frequency source;
   wherein when a primary power source is unavailable, the output frequency is generated from the oscillator frequency and the reference frequency source is periodically pulse powered-on to calibrate the electronic oscillator;

wherein the frequency generator integrated circuit is packaged using chip scale packaging.

33. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the output frequency comprises a low frequency and wherein the reference frequency comprises a high frequency.

34. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the output frequency comprises a real time clock frequency and wherein the reference frequency comprises a megahertz frequency.

35. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the reference frequency source comprises a quartz crystal.

36. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the output frequency is one of a plurality of generated output frequencies.

37. The method of claim 36, wherein each of the plurality of generated output frequencies is based on or generated from the reference frequency source.

38. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the electronic oscillator is calibrated at a low duty cycle to conserve power.

39. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the output frequency is generated at very low power consumption when the primary power source is unavailable.

40. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein an accuracy of the output frequency is comparable to an accuracy of the reference frequency.

41. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the calibration circuitry comprises one or more counters.

42. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the calibration circuitry comprises a frequency-locked loop.

43. The method of claim 42, wherein the calibration circuitry comprises a sigma-delta modulator.

44. A method for generating an output frequency, comprising:
configuring an electronic oscillator to generate an oscillator frequency;

configuring calibration circuitry to periodically calibrate the electronic oscillator with respect to a reference frequency source; and when a primary power source is unavailable, generating the output frequency from the oscillator frequency and periodically pulse powering-on the reference frequency source to calibrate the electronic oscillator;

wherein the calibration circuitry comprises circuitry to trim the electronic oscillator.

45. A method for generating an output frequency, comprising:

configuring an electronic oscillator to generate an oscillator frequency;

configuring calibration circuitry to periodically calibrate the electronic oscillator with respect to a reference frequency source; and when a primary power source is unavailable, generating the output frequency from the oscillator frequency and periodically pulse powering-on the reference frequency source to calibrate the electronic oscillator;

wherein the calibration circuitry comprises circuitry for compensating an error.

46. A method for generating an output frequency, comprising:

configuring an electronic oscillator to generate an oscillator frequency;

configuring calibration circuitry to periodically calibrate the electronic oscillator with respect to a reference frequency source;

configuring spread spectrum circuitry to reduce electromagnetic interference; and when a primary power source is unavailable, generating the output frequency from the oscillator frequency and periodically pulse powering-on the reference frequency source to calibrate the electronic oscillator.

47. A method for generating an output frequency, comprising:

configuring an electronic oscillator to generate an oscillator frequency;

configuring calibration circuitry to periodically calibrate the electronic oscillator with respect to a reference frequency source;

configuring circuitry for reducing jitter in the reference frequency; and when a primary power source is unavailable, generating the output frequency from the oscillator frequency and periodically pulse powering-on the reference frequency source to calibrate the electronic oscillator.

48. A method for generating an output frequency, comprising:

configuring an electronic oscillator to generate an oscillator frequency;

configuring calibration circuitry to periodically calibrate the electronic oscillator with respect to a reference frequency source;

configuring circuitry for enabling and disabling the calibration circuitry; and when a primary power source is unavailable, generating the output frequency from the oscillator frequency and periodically pulse powering-on the reference frequency source to calibrate the electronic oscillator.

49. A method for generating an output frequency, comprising:

configuring an electronic oscillator to generate an oscillator frequency;

configuring calibration circuitry to periodically calibrate the electronic oscillator with respect to a reference frequency source; and when a primary power source is unavailable, generating the output frequency from the oscillator frequency and periodically pulse powering-on the reference frequency source to calibrate the electronic oscillator;

wherein a calibration frequency for calibrating the electronic oscillator is dithered.

50. A method for generating an output frequency, comprising:

configuring an electronic oscillator to generate an oscillator frequency;

configuring calibration circuitry to periodically calibrate the electronic oscillator with respect to a reference frequency source; and when a primary power source is unavailable, generating the output frequency from the oscillator frequency and periodically pulse powering-on the reference frequency source to calibrate the electronic oscillator;

wherein the primary power source comprises a wall power unit or main battery.

51. A method for generating an output frequency, comprising:

configuring an electronic oscillator to generate an oscillator frequency;

configuring calibration circuitry to periodically calibrate the electronic oscillator with respect to a reference frequency source; and when a primary power source is unavailable, generating the output frequency from the oscillator frequency and periodically pulse powering-on the reference frequency source to calibrate the electronic oscillator;

wherein when the primary power source is unavailable, essential circuitry is powered using a secondary power source.

52. The method of claim 51, wherein the secondary power source comprises a back-up battery.

53. A method for generating an output frequency, comprising:

configuring an electronic oscillator to generate an oscillator frequency;

configuring calibration circuitry to periodically calibrate the electronic oscillator with respect to a reference frequency source;

configuring regulator circuitry comprising an alternately enabled and disabled bandgap regulator and a low power sample-and-hold circuit; and when a primary power source is unavailable, generating the output frequency from the oscillator frequency and periodically pulse powering-on the reference frequency source to calibrate the electronic oscillator.

54. A method for generating an output frequency, comprising:

configuring an electronic oscillator to generate an oscillator frequency;

configuring calibration circuitry to periodically calibrate the electronic oscillator with respect to a reference frequency source;

configuring circuitry for switching between power supplies having different, non-zero values; and when a primary power source is unavailable, generating the output frequency from the oscillator frequency and periodically pulse powering-on the reference frequency source to calibrate the electronic oscillator.

55. A method for generating an output frequency, comprising:

configuring an electronic oscillator to generate an oscillator frequency;
configuring calibration circuitry to periodically calibrate the electronic oscillator with respect to a reference frequency source;
configuring a frequency divider for generating the output frequency from the reference frequency when a primary power source is available; and
when the primary power source is unavailable, generating the output frequency from the oscillator frequency and periodically pulse powering-on the reference frequency source to calibrate the electronic oscillator.

56. A method for generating an output frequency, comprising:
configuring an electronic oscillator to generate an oscillator frequency;
configuring calibration circuitry to periodically calibrate the electronic oscillator with respect to a reference frequency source;
configuring one or more phase-locked loops to generate one or more output frequencies including the output frequency from the reference frequency when a primary power source is available; and
when the primary power source is unavailable, generating the output frequency from the oscillator frequency and periodically pulse powering-on the reference frequency source to calibrate the electronic oscillator.

57. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the electronic oscillator and the calibration circuitry comprise an integrated circuit and wherein the electronic oscillator includes one or more external components that are not integrated into the integrated circuit.

58. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the electronic oscillator and the calibration circuitry are part of an integrated circuit and wherein the integrated circuit further comprises integrated battery charger circuitry.

59. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the electronic oscillator and the calibration circuitry are part of an integrated circuit and wherein the integrated circuit further comprises integrated non-volatile memory.

60. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the electronic oscillator and the calibration circuitry are part of an integrated circuit and wherein the integrated circuit is included in a watch or clock.

61. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the electronic oscillator and the calibration circuitry are part of an integrated circuit and wherein the integrated circuit is included in a device that includes real time clock circuitry.

62. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the output frequency drives a plurality of clock inputs in an associated system.

63. A method for generating an output frequency, comprising:
configuring an electronic oscillator to generate an oscillator frequency;
configuring calibration circuitry to periodically calibrate the electronic oscillator with respect to a reference frequency source; and
when a primary power source is unavailable, generating the output frequency from the oscillator frequency and periodically pulse powering-on the reference frequency source to calibrate the electronic oscillator;
wherein the electronic oscillator and the calibration circuitry are part of an integrated circuit and wherein the integrated circuit is packaged with the reference frequency source in a single package.

64. A method for generating an output frequency, comprising:
configuring an electronic oscillator to generate an oscillator frequency;

configuring calibration circuitry to periodically calibrate the electronic oscillator with respect to a reference frequency source; and when a primary power source is unavailable, generating the output frequency from the oscillator frequency and periodically pulse powering-on the reference frequency source to calibrate the electronic oscillator;

wherein the electronic oscillator and the calibration circuitry are part of an integrated circuit and wherein the integrated circuit is packaged using chip scale packaging.

* * * * *